(12) United States Patent
Wang

(10) Patent No.: US 9,504,165 B2
(45) Date of Patent: Nov. 22, 2016

(54) METHOD OF FORMING CONDUCTIVE TRACES ON INSULATED SUBSTRATE

(71) Applicant: LUXSHARE-ICT CO., LTD., Taipei (TW)

(72) Inventor: Devin Wang, Kunshan (CN)

(73) Assignee: LUXSHARE PRECISION INDUSTRY CO., LTD., Shenzhen, Guangdong Province (CN)

( * ) Notice: Subject to any disclaimer, the term of this patent is extended or adjusted under 35 U.S.C. 154(b) by 340 days.

(21) Appl. No.: 14/161,122

(22) Filed: Jan. 22, 2014

(65) Prior Publication Data

US 2015/0181718 A1    Jun. 25, 2015

(30) Foreign Application Priority Data

Dec. 20, 2013    (TW) .............................. 102147375 A

(51) Int. Cl.
| | | |
|---|---|---|
| H05K 3/18 | (2006.01) | |
| H05K 3/14 | (2006.01) | |
| B23K 26/36 | (2014.01) | |
| B23K 26/40 | (2014.01) | |
| H05K 3/06 | (2006.01) | |

(52) U.S. Cl.
CPC ............. *H05K 3/188* (2013.01); *B23K 26/362* (2013.01); *B23K 26/364* (2015.10); *B23K 26/40* (2013.01); *H05K 3/061* (2013.01); *H05K 3/146* (2013.01); *B23K 2203/172* (2015.10); *B23K 2203/50* (2015.10); *H05K 3/143* (2013.01); *H05K 2201/09018* (2013.01); *Y10T 29/49155* (2015.01)

(58) Field of Classification Search
CPC ........ H05K 3/00; H05K 3/007; H05K 3/184; H05K 3/061; H05K 3/143; H05K 3/146; H05K 3/188; H05K 2201/09018; B23K 26/364; B23K 26/362; B23K 23/40; B23K 2203/172; B23K 2203/50; Y10T 29/49155
See application file for complete search history.

(56) References Cited

U.S. PATENT DOCUMENTS

| | | | | |
|---|---|---|---|---|
| 4,855,102 | A * | 8/1989 | Okada ....................... | B22F 3/10 257/E21.517 |
| 4,865,873 | A * | 9/1989 | Cole, Jr. ................ | H05K 3/184 427/271 |
| 5,576,073 | A * | 11/1996 | Kickelhain ............ | H05K 3/184 216/65 |
| 7,033,648 | B1 * | 4/2006 | Doany ................ | C23C 18/1605 216/65 |
| 7,084,014 | B2 * | 8/2006 | Antesberger ........ | H01L 21/4846 257/E23.07 |
| 7,476,827 | B1 * | 1/2009 | Bhullar ............ | G01N 33/48771 219/121.69 |

* cited by examiner

*Primary Examiner* — Carl Arbes
(74) *Attorney, Agent, or Firm* — Cheng-Ju Chiang

(57) ABSTRACT

A method of forming conductive traces on insulated substrate includes the steps of providing an insulated substrate; forming a coating layer on a surface of the insulated substrate, dividing the coating layer into traces-forming zones and non-traces-forming zones through laser engraving, and removing areas of the coating layer that are located in the traces-forming zones through laser-vaporizing to expose corresponding portions of the surface of the insulated substrate; forming a metallized layer of conductive traces by performing a metallizing treatment on the exposed portions of the insulated substrate and on the coating layer; and directly stripping off the residual coating layer from the non-traces-forming zones or removing it using an acid, an alkaline or a neutral solution.

10 Claims, 6 Drawing Sheets

```
┌─────────────────────────────────────────────────────────────┐
│              Provide an insulated substrate.                │
└─────────────────────────────────────────────────────────────┘
                              ⇩
┌─────────────────────────────────────────────────────────────┐
│ Forming a coating layer on a surface of the insulated substrate through a │
│ process selected from the group consisting of spray coating, pad printing, │
│        screen printing, roller coating and impregnating.    │
└─────────────────────────────────────────────────────────────┘
                              ⇩
┌─────────────────────────────────────────────────────────────┐
│ Using a laser beam to laser engrave the coating layer, so that the coating layer │
│ is divided into traces-forming zones and non-traces-forming zones;meanwhile, │
│     using the laser beam to laser-vaporize and accordingly remove areas of the │
│ coating layer in the traces-forming zones to expose portions of the surface of the │
│    underlying insulated substrate that are corresponding to the laser-vaporized │
│                      areas of the coating layer.           │
└─────────────────────────────────────────────────────────────┘
                              ⇩
┌─────────────────────────────────────────────────────────────┐
│   Form a metallized layer of conductive traces by performing a metallizing │
│  treatment on the exposed portions of the surface of the insulated substrate and │
│                        on the coating layer.               │
└─────────────────────────────────────────────────────────────┘
                              ⇩
┌─────────────────────────────────────────────────────────────┐
│ Removing any part of the coating layer and of the metallized layer of conductive │
│    traces that are located in the non-traces-forming zones by directly stripping │
│       them off or through an action of an acid solution, an alkaline solution or a │
│    neutral solution, so that the metallized layer of conductive traces is left only │
│ on the portions of the surface of the insulated substrate that are corresponding to │
│                        the traces-forming zones.           │
└─────────────────────────────────────────────────────────────┘
                              ⇩
┌─────────────────────────────────────────────────────────────┐
│         Form a metal protection layer on the conductive traces.        │
└─────────────────────────────────────────────────────────────┘
                              ⇩
┌─────────────────────────────────────────────────────────────┐
│   Coat the surface portions of the insulated substrate in the │
│   non-traces-forming zones with an insulation protection layer. │
└─────────────────────────────────────────────────────────────┘
                              ⇩
┌─────────────────────────────────────────────────────────────┐
│                              End.                           │
└─────────────────────────────────────────────────────────────┘
```

FIG. 1

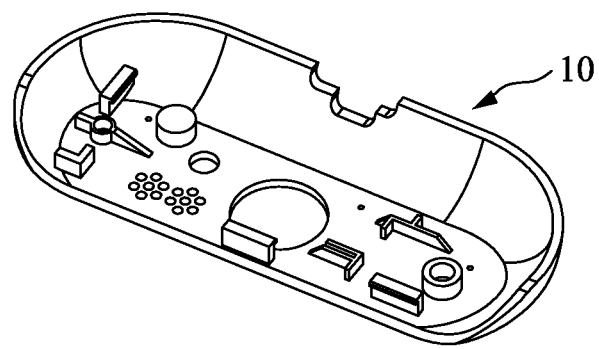
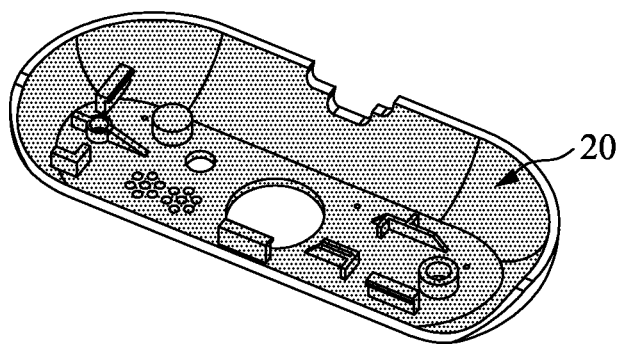
FIG. 3

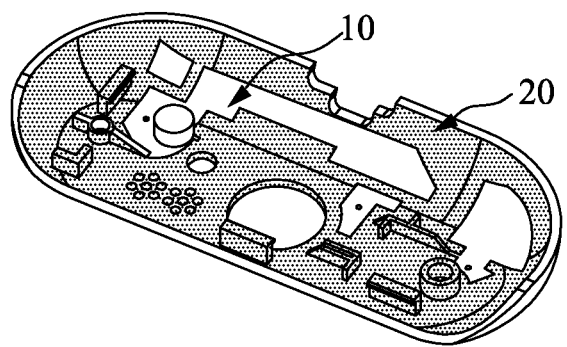
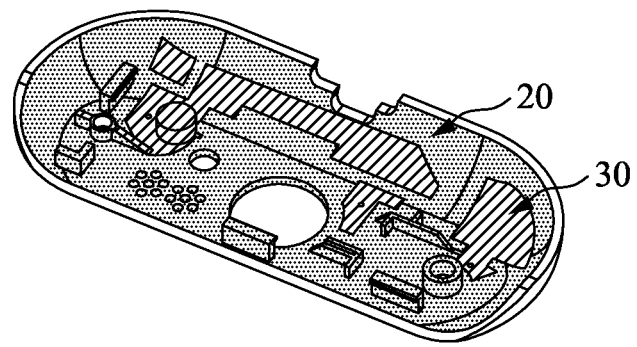
FIG. 4

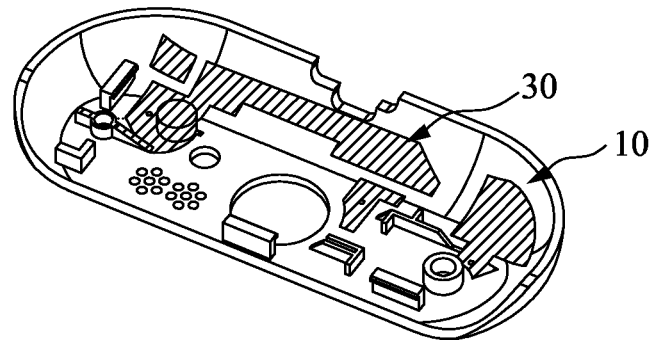
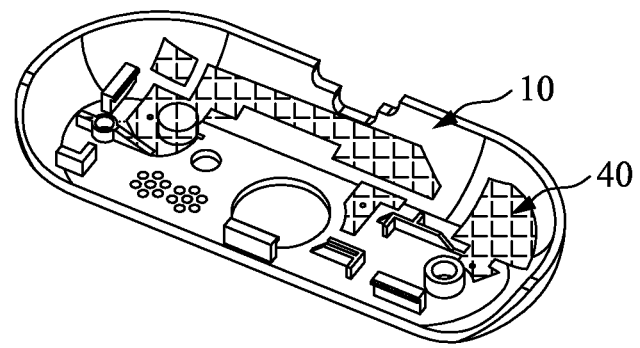
FIG. 5

METHOD OF FORMING CONDUCTIVE TRACES ON INSULATED SUBSTRATE

FIELD OF THE INVENTION

The present invention relates to a method of forming conductive traces on an insulated substrate, and more particularly to a method with which three-dimensionally patterned conductive traces can be formed on a three-dimensional insulated substrate.

BACKGROUND OF THE INVENTION

While the rapid development of light emitting diode (LED) in the electronic industry enables constantly increased density of circuits on a circuit board, the heat accumulated on the circuit board in use also increases and can not be easily removed. Generally speaking, in the event the heat energy produced by LEDs when they emit light is not properly dissipated, the LEDs would have excessively high junction temperature to adversely affect the service life, luminous efficiency and stability thereof.

To obtain upgraded LED luminous efficiency and service life, one of the currently most important tasks is to solve the heat dissipation problem of the LED products. Since the LED industry aims to develop high-power, high-brightness and small-sized LED products, it has also become an important trend in future development of LED products to provide a heat dissipation LED substrate having high thermal conductivity and precision dimensions. Currently, the main trends for developing upgraded LED luminous efficiency include the use of aluminum nitride substrate in place of aluminum oxide substrate and the use of eutectic process or flip chip process in place of gold wire bonding process to electrically connect an LED die to a substrate. In the above two LED developing trends, extremely strict requirements have been set for the highly accurate alignment of circuits on the heat dissipation substrate, and the heat dissipation substrate must have high heat dissipation ability, small dimensions and good adhesion to metal traces.

The technique for fabricating printed circuit board (PCB) has become highly mature in recent years. In the early stage, most of the system circuit boards for LED products are PCBs. However, PCBs have limited heat dissipation ability and therefore could not be used with high-power LED products, whose demand has largely increased in recent years. To solve the high-power LED's problem in heat dissipation, some manufacturers have adopted a type of metal core printed circuit board (MCPCB) that has high thermal conductivity. That is, good heat dissipation ability of metal materials is utilized to achieve the purpose of dissipating heat produced by high-power LED products. However, due to the constantly increased demand for high LED brightness and performance, the improved system circuit board capable of effectively dissipating the heat produced by the LED chips into ambient air is now not good enough for use because the heat produced by the LED dies can not be effectively transferred from the dies to the system circuit board for dissipation.

The currently available electrically insulating materials include ceramic materials and high thermal conduction plastic materials. Ceramic materials have been utilized by human for thousands of years. The ceramic materials prepared with modern technology have the advantages of good insulating ability, high heat-transfer rate, high infrared radiation rate, low thermal expansion coefficient and the like, and have gradually become the new materials for LED lighting.

Presently, ceramic materials are mainly used as heat sink materials for LED chip packaging, circuit board materials and radiator materials for lighting products. The high thermal conductivity plastic materials have excellent electrical insulating ability and low density but are expensive and accordingly have low utilization rate. Nevertheless, the high thermal conductivity plastic materials are also found in the heat dissipation material market.

Currently, there are four types of popular ceramic heat dissipation substrates, namely, high-temperature co-fired ceramic (HTCC) multilayer substrate, low-temperature co-fired ceramic (LTCC) multilayer substrate, direct bonded copper (DBC) substrate, and direct plated copper (DPC) substrate. HTCC is a technology developed in an earlier stage. HTCC requires a relatively high sintering temperature. Therefore, only limited materials can be selected for use as electrodes in HTCC technology, and the manufacturing cost thereof is relatively high. These disadvantageous factors bring to the development of LTCC, which has a lower co-firing temperature of around 850° C. compared to HTCC. However, with LTCC, it is uneasy to control the product's size accuracy and strength. As to DBC and DPC, they are specialized technology developed and becoming mature only in recent years, and allow mass production of heat dissipation substrates. DBC uses high temperature to bond a copper sheet to an aluminum oxide tile. The bottleneck in DBC is the micropores that exist between the aluminum oxide tile and the copper sheet and could not be easily removed to thereby form a considerably big challenge in the mass productivity and the yield rate of products. The DPC utilizes the technique of direct copper plating to deposit copper on an aluminum oxide substrate. This process combines material and thin film technology with it to create a product that has become the most popular ceramic heat dissipation substrate in recent years. However, DPC requires high material control and technology integration, which forms a high technical threshold for manufacturers to enter the DPC industry and stably produce ceramic heat dissipation substrates.

Therefore, it is necessary to provide a manufacturing method for solving the aforesaid technological problems.

SUMMARY OF THE INVENTION

A primary object of the present invention is to provide a simple, reliable and economical method of forming conductive traces on insulated substrate, which has the advantages of simplified manufacturing flow, shortened developing cycle, lowered manufacturing cost, and achieving increased adhesion between the metallized layer of conductive traces and the insulated substrate.

Another object of the present invention is to provide a method of forming conductive traces on insulated substrate, in which the quantity of material needed to form the metallized layer of conductive traces is reduced and laser techniques are employed to precisely, easily and conveniently control the sizes of the conductive traces to be formed, so that the obtained conductive traces are thin, straight and smooth.

To achieve the above and other objects, the method of the present invention for forming conductive traces on insulated substrate includes the following steps: (1) providing an insulated substrate; (2) forming a coating layer on a surface of the insulated substrate through spray coating, pad printing, screen printing, roller coating or impregnating; (3) using a laser beam to divide the coating layer into traces-forming zones and non-traces-forming zones through laser engraving, meanwhile, using the laser beam to remove areas of the coating layer located in the traces-forming zones through laser-vaporizing to expose portions of the surface of the underlying insulated substrate that are corresponding to the laser-vaporized areas of the coating layer; (4) forming a metallized layer of conductive traces by performing a metallizing treatment on the exposed portions of the surface of the insulated substrate and on the coating layer; and (5) removing any part of the coating layer and of the metallized layer of conductive traces that are located in the non-traces-forming zones by directly stripping them off or through an action of an acid solution, an alkaline solution or a neutral solution, so that the metallized layer of conductive traces is left only on the portions of the surface of the insulated substrate that are corresponding to the traces-forming zones.

In a preferred embodiment, the method further includes a step (6) for forming a metal protection layer on the metallized layer of conductive traces through electroplating or chemical deposition. The metal protection layer so formed is one single metal layer selected from the group consisting of a chemical silver plating, a chemical zirconium plating, a tin plating and a tin alloy plating, or includes a chemical gold plating deposited on a top of a chemical nickel plating.

According to the present invention, the insulated substrate can be a two-dimensional structure or a three-dimensional structure, and the coating layer is a two-dimensional or a three-dimensional ink layer corresponding to the shape of the insulated substrate; and the insulated substrate is made of a ceramic material or a glass material, and the ceramic material can be aluminum oxide, aluminum nitride or silicon carbide. Alternatively, the insulated substrate can be made of a synthetic resin material or a composite material. The synthetic material can be polycarbonate (PC), polycarbonate/acrylonitrile butadiene styrene (PC/ABS), nylon or acrylic; and the composite material can be made by combining fiberglass with PC, PC/ABS or nylon. However, the above mentioned materials are only illustrative and not intended to limit the present invention in any way.

In the present invention, the laser beam used for laser engraving the coating layer is digitally controlled and has a wavelength between 355 and 1064 nanometers (nm). The laser beam is further guided for point focusing on the traces-forming zones to not only laser-vaporize of the coating layer thereof, but also coarsen the exposed surface portions of the insulated substrate through laser engraving to create a plurality of pits of different depth. With these pits, an increased adhesion between the insulated substrate and the metallized layer of conductive traces can be obtained in the subsequent metallizing treatment.

According to the present invention, the metallizing treatment can be sputtering deposition, vapor deposition, electroplating, chemical deposition, low-temperature plasma jet, or a combination of any two of the previous processes; and the material for the metallizing treatment can be pure copper or a copper alloy.

According to the present invention, the metallized layer of conductive traces can be one single circuit structure located on the surface of the insulated substrate, or a plurality of circuit structures located at different portions of the surface of the insulated substrate.

The method of forming conductive traces on insulated substrate according to the present invention is simple, reliable and economical. It not only reduces the quantity of material needed to form the metallized layer of conductive traces, but also enables precise, easy and convenient control of the sizes of the conductive traces to be formed, so that the obtained conductive traces are thin, straight and smooth and the adhesion between the conductive traces and the insulated substrate is increased.

BRIEF DESCRIPTION OF THE DRAWINGS

The structure and the technical means adopted by the present invention to achieve the above and other objects can be best understood by referring to the following detailed description of the preferred embodiment and the accompanying drawings, wherein FIG. 1 is a flowchart showing the steps included in a method of forming conductive traces on insulated substrate according to a preferred embodiment of the present invention;

FIGS. 3 to 6 schematically illustrate the forming of conductive traces on a three-dimensional insulated substrate according to the method of the present invention.

DETAILED DESCRIPTION OF THE PREFERRED EMBODIMENTS

To better understand the objects, technical solutions and advantages thereof, the present invention will now be described with a preferred embodiment thereof and with reference to the accompanying drawings.

Figure 2:
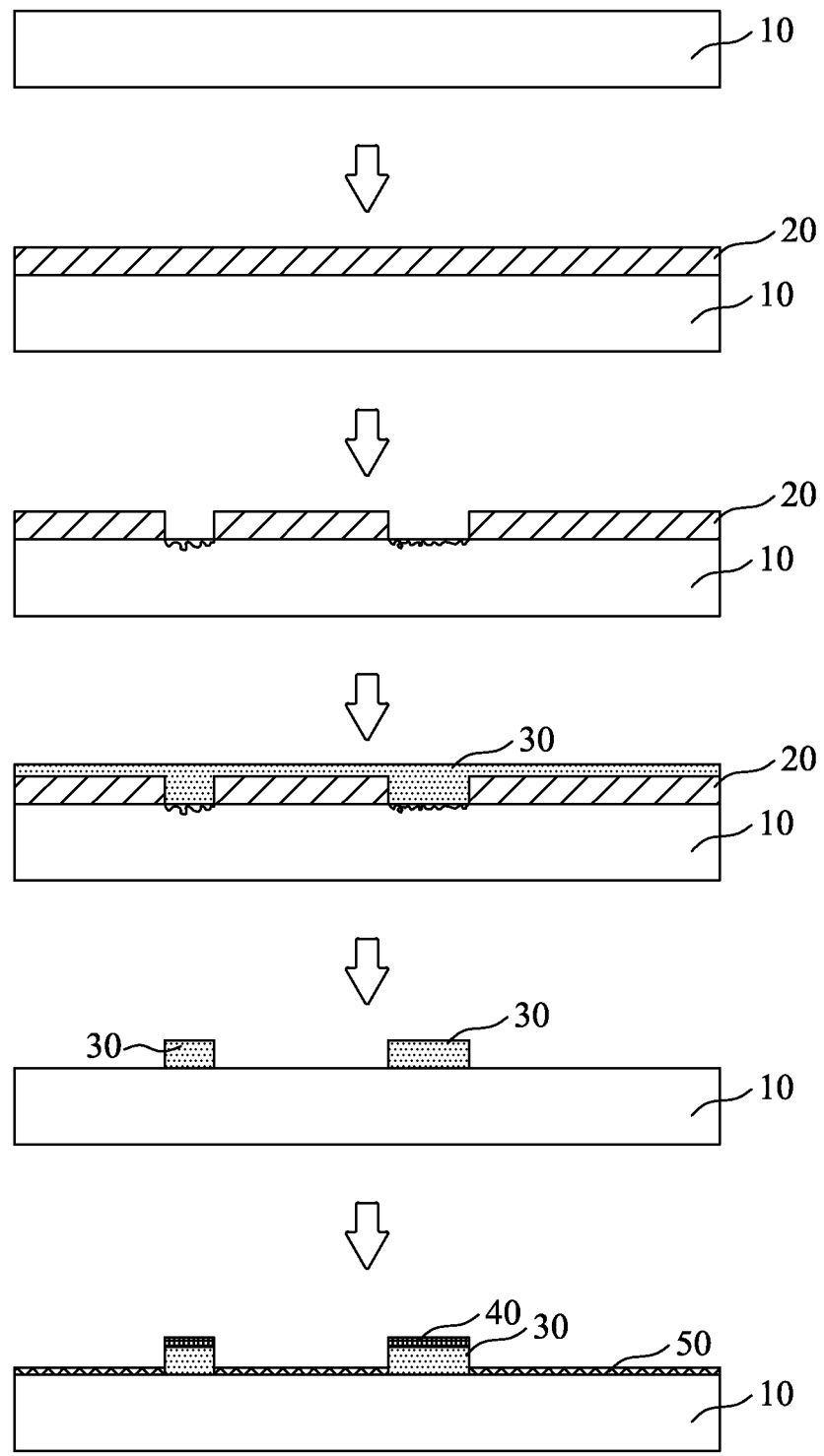
FIG. 2 schematically illustrates the forming of conductive traces on a two-dimensional insulated substrate according to the method of the present invention.
Figure 6:
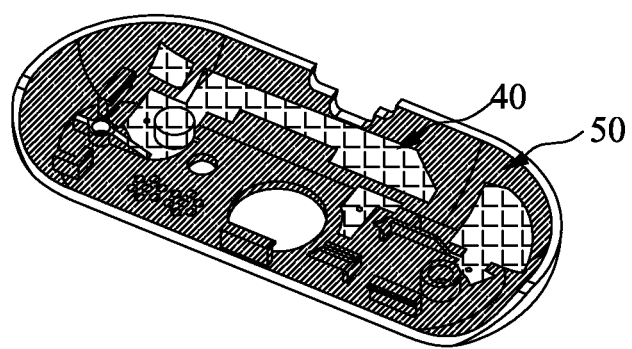

Please refer to FIGS. 1 through 6. Steps included in a method of forming conductive traces on insulated substrate according to a preferred embodiment of the present invention are described in details as below.

First, provide an insulated substrate 10, which can be a two-dimensional structure or a three-dimensional structure. In the present invention, no particular limitation has been set on the materials of the insulated substrate 10. According to an operable embodiment of the present invention, the insulated substrate 10 can be made of a ceramic material, such as aluminum oxide, aluminum nitride or silicon carbide, or can be made of a glass material. Alternatively, the insulated substrate 10 can be made of a synthetic resin material, such as polycarbonate (PC), polycarbonate/acrylonitrile butadiene styrene (PC/ABS), nylon or acrylic, or can be made of a composite material made by combining fiberglass with PC, PC/ABS or nylon. It is understood the above listed materials are only illustrative and not intended to limit the present invention in any way.

Second, form a two-dimensional or a three-dimensional ink coating layer 20 on a surface of the insulated substrate 10 by spray coating, pad printing, screen printing, roller coating or impregnating, such that the coating layer 20 has a shape corresponding to that of the surface of the insulated substrate 10. In the case of a two-dimensional insulated substrate 10, a two-dimensional coating layer 20 can be formed thereon by way of spray coating, screen printing or roller coating. On the other hand, in the case of a three-dimensional insulated substrate 10, a three-dimensional coating layer 20 can be formed thereon by way of spray coating, pad printing or impregnating. The coating layer 20 can be formed using an oil-based or a water-based material. In a preferred embodiment, the coating layer 20 is formed using a type of insulation paint having a predetermined viscosity and capable of creating a desired smooth surface.

Third, use specific computer software to control a laser beam having a wavelength between 355 and 1064 nanometers (nm) to laser engrave the coating layer 20 and the surface of the insulated substrate 10, so that the coating layer 20 is divided into several different zones, namely, some traces-forming zones and some non-traces-forming zones, to precisely control, with the aid of computer program, the dimensions and location of a conductive trace pattern on the insulated substrate 10 for forming desired conductive traces 30 later. Meanwhile, the laser beam is guided under digital control to point focus on and laser-vaporize areas of the coating layer 20 that are located in the traces-forming zones, so as to expose portions of the surface of the underlying insulated substrate 10 that are corresponding to the laser-vaporized areas of the coating layer 20. Meanwhile, the exposed surface portions of the insulated substrate 10 are also coarsened under the effect of laser engraving to form a plurality of pits of different depths. With these pits, an increased adhesion between the insulated substrate 10 and the later-formed conductive traces 30 can be obtained.

In the present invention, the conductive trace pattern is fabricated on the insulated substrate 10 through a laser process. More specifically, the conductive trace pattern is fabricated through laser engraving using a laser beam under control of a computer three-dimensional (3D) program. Therefore, desired conductive traces 30 can be formed not only on the two-dimensional insulated substrate 10, but also on the three-dimensional insulated substrate 10. The use of computer software in the controlled fabrication of the conductive trace pattern not only satisfies the demand for forming conductive traces 30 on both two-dimensional and three-dimensional insulated substrates, but also saves many different processes that are employed in the conventional printed circuit board (PCB) printing process, such as dry film laminating, exposing, developing and etching processes. Moreover, with the computer 3D program-controlled laser engraving, it is able to form the conductive traces 30 within one single area or multiple different areas on the two-dimensional or the three-dimensional insulated substrate 10 without being limited by the surface shape of the insulated substrate 10 and the positions for the conductive traces 30. In brief, with the computer 3D program and the above-described steps, the shapes and sizes of the conductive traces 30 to be formed can be more easily and conveniently controlled to realize the advantages of simplified manufacturing flow, shortened developing cycle, increased adhesion between the insulated substrate and later-formed metallized layer, and lowered manufacturing cost. Meanwhile, since no environmentally unfriendly substances, such as photoresist and developing agent, are required in the forming of the conductive traces 30, the method according to the present invention is environmentally friendly to meet the requirement for green production.

Fourth, perform a metallizing treatment on the exposed surface portions of the insulated substrate 10 in the traces-forming zones and on the coating layer 20 for forming conductive traces 30. The metallizing treatment can be sputtering deposition, vapor deposition, electroplating or low-temperature plasma jet. The material for the metallizing treatment can be copper, nickel, or any copper-nickel alloy. The conductive traces 30 so formed can be one single circuit structure located on the insulated substrate 10, or can be multiple circuit structures located at different portions of the surface of the insulated substrate 10. In a preferred embodiment, the metallizing treatment may be a combination of any two different processes selected from the group consisting of sputtering deposition, vapor deposition, electroplating and low-temperature plasma jet for forming a metallized layer of conductive traces 30, so as to achieve upgraded process efficiency and effectiveness. With the above-described metallizing treatment, the metallized layer so formed can firmly adhere to the surface of the insulated substrate 10 to thereby effectively increase the tear strength or the adhesion strength of the conductive traces 30 formed on the insulated substrate 10, not only allowing the conductive traces 30 to be thin, straight and smooth, but also giving the finished product, i.e. the insulated substrate 10 with the conductive traces 30 formed thereon, a reinforced overall structural strength as well as upgraded heat dissipation effect.

According to the present invention, the metallized layer of conductive traces 30 can be directly formed on the insulated substrate 10 through electrolysis, chemical deposition or sputtering deposition without the need of other procedures, such as laser drilling or adding vias on the insulated substrate. Besides, the metallized layer may reach a thickness larger than 50 μm simply through one-step process without the need of gradually increasing the thickness thereof in subsequent processes. Therefore, the method of the present invention can simplify manufacturing process and lower manufacturing cost. In a preferred embodiment, a coarsening pretreatment may be added to enable further increased adhesion between the metallized layer and the surface of the insulated substrate 10.

Finally, any part of the coating layer 20 and the metallized layer of conductive traces 30 located in the non-traces-forming zones are stripped off from the surface of the insulated substrate 10 directly or through the action of an acid solution, an alkaline solution or a neutral solution.

In an operable embodiment, the method of the present invention may further include a sixth step. In the sixth step, a metal protection layer 40 is formed on the surfaces of the metallized layer of conductive traces 30 in the traces-forming zones through an electroplating process or a chemical deposition process. The surface of the metal protection layer 40 can be optimized through grinding, polishing or planing. More specifically, the metal protection layer 40 so formed is one single metal layer selected from the group consisting of a chemical silver plating, a chemical zirconium plating, a tin plating and a tin alloy plating, or includes a chemical gold plating deposited on a top of a chemical nickel plating. After the metal protection layer 40 is formed, the portions of the surface of the insulated substrate 10 corresponding to the non-traces-forming zones, from which the coating layer 20 has already been removed, are further coated with an insulation protection layer 50 to complete the method of forming conductive traces 30 on the insulated substrate 10.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A method of forming conductive traces on insulated substrate, comprising the following steps:
   (1) providing an insulated substrate;
   (2) forming a coating layer on a surface of the insulated substrate through a process selected from the group consisting of spray coating, pad printing, screen printing, roller coating and impregnating;
   (3) using a laser beam to laser engrave the coating layer, so that the coating layer is divided into traces-forming zones and non-traces-forming zones;
   meanwhile, using the laser beam to laser-vaporize and accordingly remove areas of the coating layer in the traces-forming zones to expose portions of the surface of the underlying insulated substrate that are corresponding to the laser-vaporized areas of the coating layer;

(4) forming a metallized layer of conductive traces by performing a metallizing treatment on the exposed portions of the surface of the insulated substrate and on the coating layer; and (5) removing any part of the coating layer and of the metallized layer of conductive traces that are located in the non-traces-forming zones by directly stripping them off or through an action of an acid solution, an alkaline solution or a neutral solution, so that the metallized layer of conductive traces is left only on the portions of the surface of the insulated substrate that are corresponding to the traces-forming zones.

2. The method of forming conductive traces on insulated substrate as claimed in claim 1, further comprising the following step after the step (5):

(6) forming a metal protection layer on the metallized layer of conductive trace through a process selected from the group consisting of electroplating and chemical deposition; wherein the metal protection layer so formed is one single metal layer selected from the group consisting of a chemical silver plating, a chemical zirconium plating, a tin plating and a tin alloy plating, or includes a chemical gold plating deposited on a top of a chemical nickel plating.

3. The method of forming conductive traces on insulated substrate as claimed in claim 1, wherein the insulated substrate is made of a material selected from the group consisting of a ceramic material and a glass material; and the ceramic material being selected from the group consisting of aluminum oxide, aluminum nitride and silicon carbide.

4. The method of forming conductive traces on insulated substrate as claimed in claim 1, wherein the insulated substrate is made of a material selected from the group consisting of a synthetic resin material and a composite material; the synthetic material being selected from the group consisting of polycarbonate (PC), polycarbonate/acrylonitrile butadiene styrene (PC/ABS), nylon and acrylic; and the composite material being made by combining fiberglass with one type of synthetic resin selected from the group consisting of PC, PC/ABS and nylon.

5. The method of forming conductive traces on insulated substrate as claimed in claim 1, wherein the insulated substrate can be a two-dimensional structure or a three-dimensional structure.

6. The method of forming conductive traces on insulated substrate as claimed in claim 1, wherein the laser beam used in step (3) has a wavelength between 355 and 1064 nanometers (nm).

7. The method of forming conductive traces on insulated substrate as claimed in claim 1, wherein, during the laser-vaporizing process in step (3), the portions of the surface of the insulated substrate that are corresponding to the laser-vaporized areas of the coating layer are also coarsened by the laser beam through laser engraving to form a plurality of pits of different depths for increasing an adhesion between the insulated substrate and the metallized layer of conductive traces formed through the metallizing treatment in the subsequent step (4).

8. The method of forming conductive traces on insulated substrate as claimed in claim 1, wherein the metallizing treatment is a process selected from the group consisting of sputtering deposition, vapor deposition, electroplating, chemical deposition, low-temperature plasma jet, and a combination of any two of the previous processes.

9. The method of forming conductive traces on insulated substrate as claimed in claim 1, wherein the metallizing treatment uses a material selected from the group consisting of pure copper and a copper alloy.

10. The method of forming conductive traces on insulated substrate as claimed in claim 1, wherein the metallized layer of conductive traces can be one single circuit structure located on the surface of the insulated substrate, or a plurality of circuit structures located at different portions of the surface of the insulated substrate.

\* \* \* \* \*